(12) United States Patent
Chang et al.

(10) Patent No.: US 11,754,923 B2
(45) Date of Patent: Sep. 12, 2023

(54) RESIST DISPENSING SYSTEM AND METHOD OF USE

(71) Applicant: TAIWAN SEMICONDUCTOR MANUFACTURING CO., LTD., Hsinchu (TW)

(72) Inventors: Ya-Ching Chang, Hsinchu (TW); Chen-Yu Liu, Kaohsiung (TW); Ching-Yu Chang, Yuansun Village (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 189 days.

(21) Appl. No.: 17/214,660

(22) Filed: Mar. 26, 2021

(65) Prior Publication Data
US 2022/0308452 A1   Sep. 29, 2022

(51) Int. Cl.
*B05D 1/00* (2006.01)
*G03F 7/16* (2006.01)
*H01L 21/67* (2006.01)
*H01L 21/02* (2006.01)

(52) U.S. Cl.
CPC ............ *G03F 7/16* (2013.01); *H01L 21/6715* (2013.01); *H01L 21/67017* (2013.01); *B05D 1/005* (2013.01); *G03F 7/162* (2013.01); *H01L 21/02282* (2013.01)

(58) Field of Classification Search
CPC ............. B01D 1/005; H01L 21/02282; H01L 21/67017; H01L 21/6715; G03F 7/162

USPC .......................................................... 427/240
See application file for complete search history.

(56) References Cited

U.S. PATENT DOCUMENTS

| 6,554,521 B1* | 4/2003 | Kobayashi | B43K 1/08 401/214 |
| 7,640,885 B2* | 1/2010 | Nakashima | B05C 11/08 118/313 |
| 10,800,174 B2* | 10/2020 | Liu | B41J 2/16552 |
| 2006/0233952 A1* | 10/2006 | Nakashima | B05C 11/08 118/313 |
| 2007/0076025 A1* | 4/2007 | Nagashima | B41J 2/1721 347/7 |

(Continued)

FOREIGN PATENT DOCUMENTS

| TW | 3-296213 A | 12/1991 |
| TW | 201313337 A | 4/2013 |

*Primary Examiner* — Brian K Talbot
(74) *Attorney, Agent, or Firm* — McDermott Will & Emery LLP

(57) ABSTRACT

In a method, a resist material is dispensed through a tube of a nozzle of a resist pump system on a wafer. The tube extends from a top to a bottom of the nozzle and has upper, lower, and middle segments. When not dispensing, the resist material is retracted from the lower and the middle segments, and maintained in the upper segment of the tube. When retracting, a first solvent is flown through a tip of the nozzle at the bottom of the nozzle to fill the lower segment of the tube with the first solvent and to produce a gap in the middle segment of the tube between the resist material and the first solvent. The middle segment includes resist material residues on an inner surface wall of the tube and vapor of the first solvent. The vapor of the first solvent prevents the resist material residues from drying.

20 Claims, 11 Drawing Sheets

(56) References Cited

U.S. PATENT DOCUMENTS

| | | | |
|---|---|---|---|
| 2007/0169690 A1* | 7/2007 | Jung | B05B 15/55 |
| | | | 118/302 |
| 2007/0212894 A1* | 9/2007 | Nakazawa | H01L 21/02087 |
| | | | 257/E21.255 |
| 2012/0164572 A1* | 6/2012 | Miyata | H01L 21/6715 |
| | | | 118/696 |
| 2017/0128962 A1* | 5/2017 | Kashiyama | B05B 3/02 |
| 2018/0047563 A1* | 2/2018 | deVilliers | H01L 21/6715 |
| 2020/0174372 A1 | 6/2020 | Hsu et al. | |

* cited by examiner

RESIST DISPENSING SYSTEM AND METHOD OF USE

BACKGROUND

Lithography is used for patterning the surface of a wafer that is covered by a resist material. The resist material is patterned so that portions of the resist material can be selectively removed to expose underlying areas of the wafer for selective processing such as etching, material deposition, implantation and the like. Photolithography utilizes light energy beams, including ultraviolet light or X-ray, for selective exposure of the resist material. Alternatively, charged particle beams, e.g., electron beams and ion beams, have been used for high resolution lithographic resist exposure.

During an integrated circuit (IC) design, a number of layout patterns of the IC, for different steps of IC processing, are generated. The layout patterns include geometric shapes corresponding to structures to be fabricated on a wafer. The layout patterns may be patterns on a mask that are projected, e.g., imaged, on a resist layer on the wafer to create the IC. A lithography process transfers the pattern of the mask to the resist layer of the wafer such that etching, implantation, or other steps are applied only to predefined regions of the wafer. The resist material is a critical component of lithographic processing. To maintain a high device yield, the resist material coated on a wafer should be free of impurities and defects such as crystallized impurities. Therefore, a dispensing mechanism for the resist material that avoids crystallization of the resist material is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
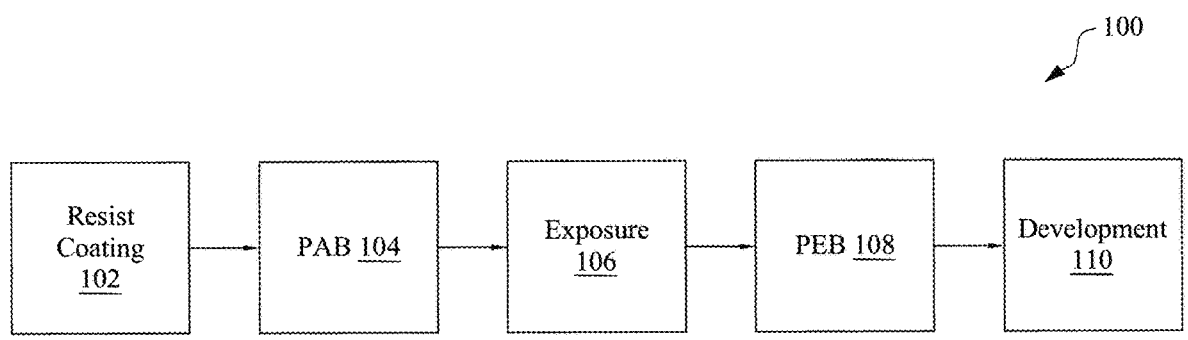
FIG. 1 illustrates an exemplary process for generating a pattern in a resist material layer on a wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, a resist material is mixed in a solvent (e.g., a first solvent) and is in a liquid form. In some embodiments, a resist material is transferred from a resist supply via a resist pump system and dispensed on a surface of a wafer, e.g., a semiconductor substrate, to coat the surface of the wafer and produce a resist layer on the wafer. In some embodiments, the resist material is a photoresist material that is sensitive to a light energy beam, e.g., deep ultraviolet (DUV) radiation or extreme ultraviolet (EUV) radiation. Then, a DUV imaging system or an EUV imaging system projects a layout pattern to the resist coated surface of the wafer. A subsequent development of the photoresist material after the exposure to DUV or EUV radiation generates the layout pattern in the photoresist material. In some embodiments, the resist material is sensitive to a charged particle beam, e.g., an electron beam, and a charged particle imaging or scanning system projects the layout pattern in the resist coated surface of the wafer. A subsequent development of the resist material after the exposure to the charged particle beam generates the layout pattern in the resist material.

The resist layer is either a positive tone resist or a negative tone resist. A positive tone resist refers to a resist material that when exposed to the charged particle beam or the actinic radiation (typically UV light, e.g., EUV) becomes soluble in a developer, while the region of the resist that is non-exposed (or exposed less) is insoluble in the developer, leaving behind the coating in areas that were not exposed. A negative tone resist, on the other hand, refers to a resist material that when exposed to the charged particle beam or the actinic radiation becomes insoluble in the developer, while the region of the resist that is non-exposed (or exposed less) is soluble in the developer. The region of a negative resist that becomes insoluble upon exposure to radiation may become insoluble due to a cross-linking reaction caused by the exposure to radiation, leaving behind the coating in areas that were exposed.

The layout pattern generated in resist material dispensed on the surface of the wafer defines the critical dimension (CD). An impurity or defect in the resist material may cause the resist material to not react accordingly and thus may generate CD non-uniformity in the layout pattern. In some embodiments, and in the case of a positive tone resist material, the defect, e.g., a crystallization of the resist material, may prevent a portion of the resist material under the defect to receive the charged particle beam or the light energy beam. Thus, the portion under the defect may not be dissolved after the application of the developer. Alternatively, the defect may not be altered by the charged particle beam or the light energy beam and, thus, the defect and the portion under the defect may not be dissolved after the application of the developer and create CD non-uniformity. In some embodiments, and in the case of a negative tone resist material, the defect may prevent a portion of the resist material under the defect to receive the charged particle beam or the light energy beam. Thus, the portion under the defect may be dissolved after the application of the developer and create CD non-uniformity.

In some embodiments, the resist material is dispensed through a nozzle of a resist pump system of a resist material dispensing system. The resist material flows through a tube in the nozzle of the resist pump system and, thus, when the resist pump system is dispensing the resist material, the tube of the nozzle is filled with the resist material. When the resist pump system is dispensing the resist material, the resist material goes from a resist tank of the resist pump system or from a resist supply to the tube to be dispensed. In some embodiments, when the resist pump system is not dispensing and the resist pump system is idle, the resist material is retracted from a bottom portion of the tube back to the resist tank or the resist supply and the bottom portion of the tube becomes an initial empty volume that is filled with the air. In some embodiments, after retracting the resist material from the bottom portion of the tube, resist material residues remain on an inner surface wall of the tube. In some embodiments, the resist material solvent evaporates and the resist material residues on the inner surface wall of the tube harden and/or crystalizes. In a subsequent dispensing of the resist material, the resist material from the resist tank or the resist supply fills the bottom portion of the tube and flows from a tip of the nozzle on a wafer. In some embodiments, the flowing resist material carries the hardened resist material residues on the inner surface wall of the tube and deposits them on the surface of the wafer. In some embodiments, the hardened resist material residues are not dissolved in the flowing resist material solvent and creates defects in the deposited resist layer on the wafer.

In some embodiments, after dispensing the resist material and to reduce the resist material residues, the tip of the nozzle of the resist pump system is cleaned by a nozzle cleaning device using anther solvent (e.g., a second solvent) that is provided to the nozzle cleaning device. In addition, after the cleaning, the other solvent is pushed by the nozzle cleaning device from the tip of the nozzle into the tube to fill a lower segment of the bottom portion of the tube. In some embodiments, after the dispensing the resist material is completed, the tip of the nozzle is cleaned and retracting the resist material in the tube and pushing the other solvent into the tube are performed around the same time. In some embodiments, another empty volume smaller than the initial empty volume is created between the retracted resist material and the other solvent to prevent the other solvent from contacting the resist material. Similarly, in some embodiments, the resist material residues that remain on the inner surface wall of the tube in the smaller empty volume, harden and create the defects in the deposited resist layer on the wafer. In some embodiments, the second solvent is selected such that the second solvent evaporates faster than the first solvent and the vapor of the second solvent fills most of the smaller empty volume and, thus, prevents the first solvent from evaporating and prevents hardening of the resist material residues on the inner surface wall of the tube in the smaller empty volume. Therefore, in a subsequent dispensing of the resist material, when the resist material from the resist tank or the resist supply fills the bottom portion of the tube and flows from a tip of the nozzle onto a wafer, the deposited resist layer on the wafer does not have defects from hardened resist material residues.

As discussed, although smaller, the smaller empty volume exist and if the resist pump system stays idle for a long time, the hardening of the resist material residues may occur. Thus, a threshold time is defined for keeping the resist pump system idle. In some embodiments, a dummy resist material dispense on a dummy wafer is performed to observe the threshold time between two consecutive dispensings of the resist material. In some embodiments, the second solvent is exposed to open air at the bottom of the tube via the tip of the nozzle and, thus, the second solvent is selected such the second solvent evaporates faster than the first solvent, however, the second solvent is selected so that it does not completely evaporate from the tip of the nozzle during the threshold time.

FIG. 1 illustrates an exemplary process 100 for generating a pattern in a resist material layer on a wafer. In some embodiments, the process 100 is performed by the control system 700 of FIG. 7 or the computer system 900 of FIGS. 9A and 9B. In operation 102, a resist layer is disposed, e.g., coated, on a top surface of a substrate, e.g., a wafer or a work piece. Disposing the resist layer on the top surface of the wafer is described with respect to FIG. 2A. At operation 104, a post application bake (PAB) is performed. The wafer including the resist layer are baked to drive out solvent in the resist material and solidify the resist layer on top of the wafer. In some embodiments, the PAB is performed at a temperature ranging from about 50° C. to about 150° C. At operation 106, the resist layer is irradiated with actinic radiation or a charged particle beam to project a pattern onto the resist layer. In some embodiments, a layout pattern on a mask is projected by an EUV radiation from an EUV light source onto the resist layer to generate the layout pattern in the resist layer on the wafer. In some embodiments, portions of the resist layer are exposed to an electron beam from an electron beam source to generate the layout pattern in the resist layer on the wafer. At operation 108, a post exposure bake (PEB) is performed on the wafer and at operation 110, by applying a developer solution, the resist material of the resist layer is developed. In some embodiments, the PEB is performed at a temperature ranging from about 40° C. to about 120° C. For a positive tone resist material, the exposed regions are developed by applying a developer solution and then are removed and the layout pattern is generated in the resist layer. For a negative tone resist material, the non-exposed regions are developed by applying the developer solution and are subsequently removed and the layout pattern is generated in the resist layer.

Figure 2A:
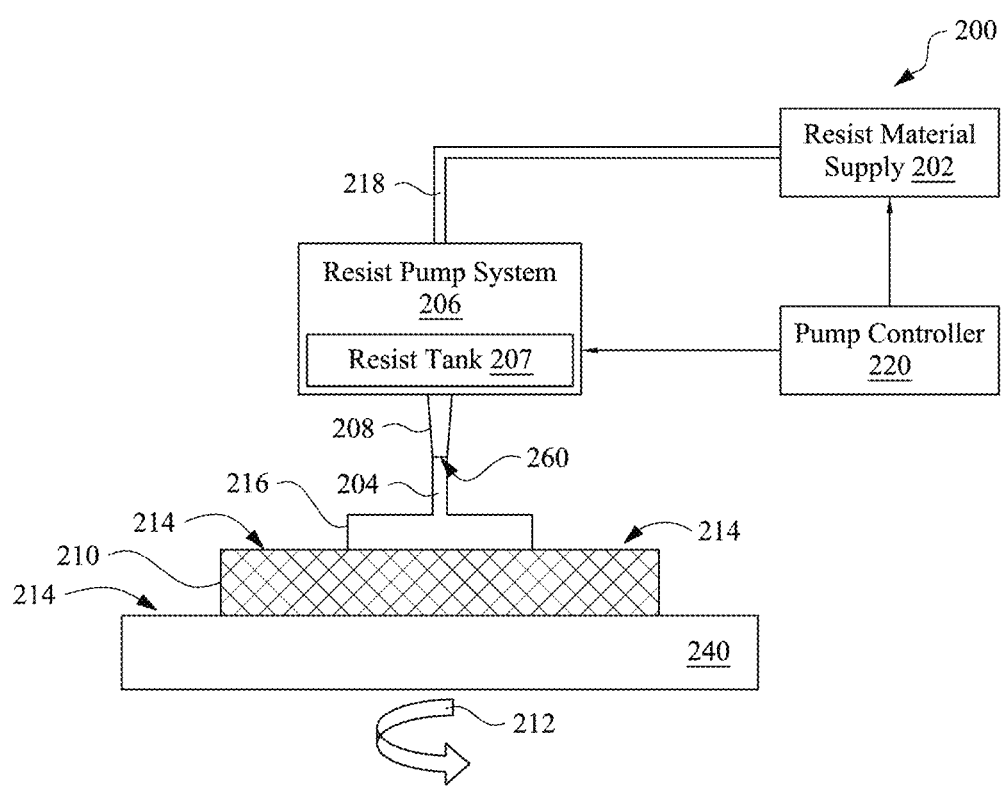
FIGS. 2A, 2B, and 2C show the operations of a resist material dispensing system when dispensing a resist material layer on a substrate and during idle storage in accordance with some embodiments of the present disclosure.
Figure 2B:
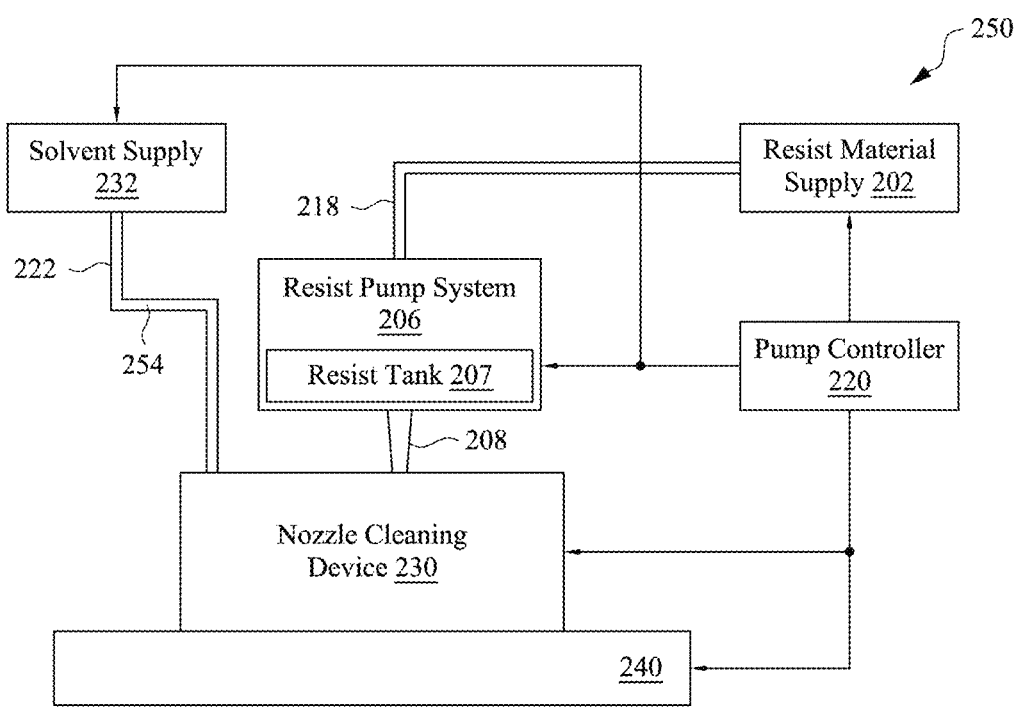
Figure 2C:
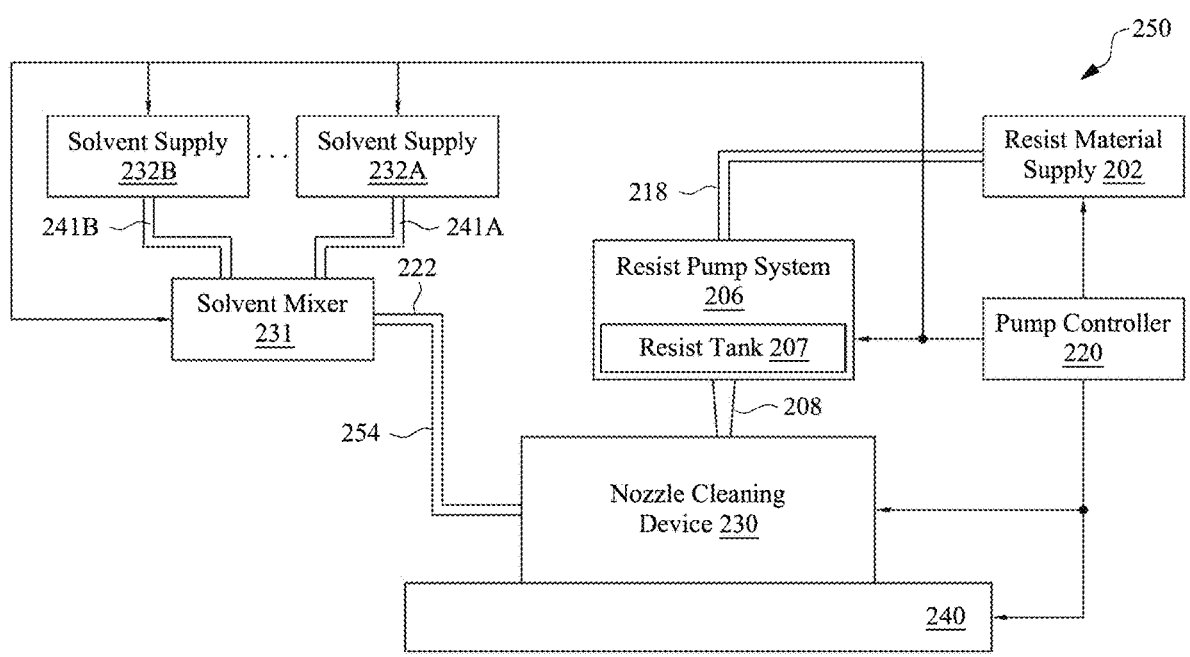

FIGS. 2A, 2B, and 2C show the operations of resist material dispensing systems 200 and 250 when dispensing a resist material layer 216 on a substrate 210 and when idle in accordance with some embodiments of the present disclosure. A resist material 204, e.g., a photoresist material, is coated on a surface of a substrate 210, e.g., a wafer, to form the resist layer 216 of FIG. 2A The resist material 204 is dispensed from a tip 260 of a resist dispensing nozzle 208. In some embodiments, a pump controller 220 is coupled to a resist pump system 206 to control a thickness of the resist layer 216 that is produced on the substrate 210. The resist pump system 206 includes the resist dispensing nozzle 208 and transfers the resist material from a resist material supply 202, via a pipe 218 (e.g., a conduit, or a tube), to the resist dispensing nozzle 208. The operation of the resist dispensing nozzle 208 is described in more details with respect to FIGS. 3A, 3B, and 6. In some embodiments, the substrate 210 is placed on a stage 240 and the stage 240 rotates around a rotation direction 212 to uniformly distribute the resist material on the substrate 210. In some embodiments, a protection segment (not shown) is coated in an edge region 214 around an edge of the substrate 210 to prevent the resist material from spilling over the edge of the substrate 210. The edge of the substrate is described with respect to FIG. 5. In some embodiments, the pump controller 220 is also coupled to a stage controller (not shown) in the stage 240 to synchronize the dispensing of the resist material and the rotation of the substrate 210. In some embodiments, the substrate 210 is used for manufacturing a semiconductor device and, thus, includes one or more layers of the semiconductor device below the resist layer 216. In some embodiments, the stage 240 rotates around a direction opposite to the rotation direction 212.

In some embodiments, the resist layer 216 is a photosensitive layer that is patterned by exposure to actinic radiation. In some embodiments, the resist layer 216 is sensitive to charged particles and the resist layer 216 is patterned by exposure to a charged particle beam, e.g., an electron beam. The chemical properties of the resist regions struck by actinic radiation or the charged particle beam may change in a manner that depends on the type of resist used. The resist layer 216 is either a positive tone resist or a negative tone resist. As shown in FIG. 2A, the resist pump system 206 includes a resist tank 207. In some embodiments, before dispensing the resist material 204 from the resist dispensing nozzle 208, the resist material 204 is transferred from the resist material supply 202 to the resist tank 207. When dispensing the resist material 204 is transferred from the resist material tank 207 to the surface of the substrate 210.

FIG. 2B shows the operation of a resist material dispensing system 250 when the resist pump system 206 is not dispensing (e.g., is idle) and the resist material dispensing system 250 is idle. As shown in FIG. 2B, the pump controller 220, in addition to the resist material supply 202 and the resist pump system 206, is coupled to and controls a solvent supply 232 and a nozzle cleaning device 230. When the resist material dispensing system 250 is idle, e.g., between two consecutive dispensings, the tip 260 of the resist dispensing nozzle 208 is placed in contact with the nozzle cleaning device 230. The pump controller 220 commands the solvent supply 232 to provide a second solvent 254 to the nozzle cleaning device 230 through a pipe 222. The pump controller 220 also commands the nozzle cleaning device 230 to use the second solvent 254 and clean the tip 260 of the resist dispensing nozzle 208. In some embodiments, and before the tip cleaning, the pump controller 220 commands the resist pump system 206 to retract the resist material 204 in the resist dispensing nozzle 208. In some embodiments, and after the tip cleaning, the pump controller 220 commands the nozzle cleaning device 230 to allow a specified amount of the second solvent 254 from the solvent supply 232 to flow, from the tip 260 of the resist dispensing nozzle 208, into the resist dispensing nozzle 208. As noted above, the operation of the resist dispensing nozzle 208 is described in more details with respect to FIGS. 3A, 3B, and 6. In some embodiments, the pump controller 220 commands the resist pump system 206 to draw the second solvent 254 from the solvent supply 232 into the resist dispensing nozzle 208.

FIG. 2C is consistent with FIG. 2B with the difference that FIG. 2C shows a plurality of solvent supplies, e.g., two or more solvent supplies. As shown, a solvent supply 232A and a solvent supply 232B provide solvents 241A and 241B to the solvent mixer 231 that is connected to and is controlled by the pump controller 220. In some embodiments, the pump controller 220 is connected to the plurality of solvent supplies and controls the plurality of solvent supplies. In some embodiments, the pump controller 220 commands the solvent supply 232A and the solvent supply 232B to provide the solvent 241A and the solvent 241B to the solvent mixer 231. The pump controller 220 also commands the solvent mixer 231 to mix the solvents of the plurality of solvent supplies according to a specific ratio and produce the second solvent 254 that is a mixture of the plurality of solvents from the plurality of solvent supplies.

Figure 3A:
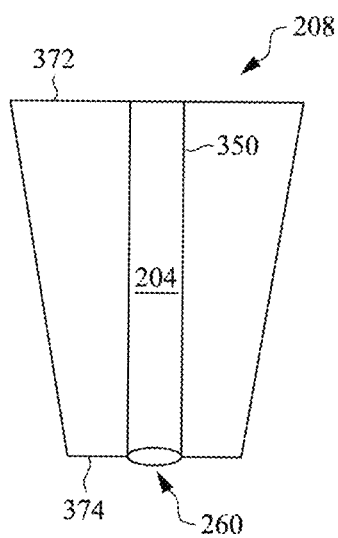
FIGS. 3A and 3B illustrate a resist dispensing nozzle of a resist pump system of the resist material dispensing system when dispensing the resist material and when the resist material dispensing system is idle.
Figure 3B:
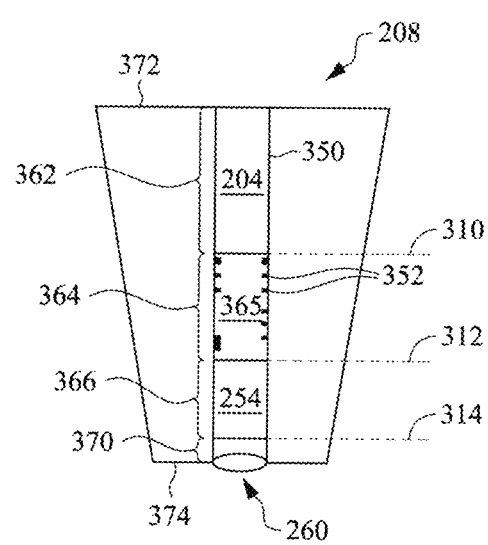

FIGS. 3A and 3B illustrate the resist dispensing nozzle 208 of the resist pump system 206 of the resist material dispensing systems 200 and 250 when dispensing the resist material and when the resist material dispensing system is idle. As shown in FIG. 3A, the resist dispensing nozzle 208 has a top 372, a bottom 374, and a tube 350 extending from the top 372 to the bottom 374. Also, as shown in FIG. 3A, when dispensing the resist material 204, the tube 350 is filled with the resist material 204 and the resist material 204 flows from the top 372 to the bottom 374 and as shown in FIG. 2A flows out of the tip 260 over the substrate 210. FIG. 3B shows the resist dispensing nozzle 208 when the resist pump system 206 of the resist material dispensing system 250 is not dispensing the resist material 204. As described with respect to FIG. 2B, the resist material 204 is retracted in the tube 350 and kept above a top level 310 in an upper segment 362 of the tube 350.

As described with respect to FIG. 2B, after retracting the resist material 204 of the tube 350 of the resist dispensing nozzle 208, the tip 260 of the resist dispensing nozzle 208 is cleaned by the nozzle cleaning device 230 and after or during the cleaning, the solvent 254 flows from the tip 260 into the tube 350. As shown in FIG. 3B, the solvent 254 fills a lower segment 366 of the tube 350 between a mid-level 312 and a bottom level 314. Also, in some embodiments, a middle segment 364 producing a gap 365 between the upper segment 362 and the lower segment 366 remains as an empty volume between the upper segment 362 and the lower segment 366. In some embodiments, the empty volume prevents the solvent 254 and the resist material 204 to come into direct contact. In some embodiments, a length of the tube 350 between the top 372 and the bottom 374 is between about 25 mm to about 40 mm. Also, lengths of the upper segment 362 and the lower segment 366 are between about 5 mm to about 15 mm. In some embodiments, the length of the middle segment 364 is between 7 mm and 10 mm. In some embodiments, a cross section area of the tube 350 is between about 25 mm² to about 100 mm².

In some embodiments, when the resist pump system 206 is retracting the resist material 204 of the tube 350 and a bottom level of the resist material 204 reaches about the mid-level 312, the resist pump system 206 pulls the solvent 254 into the tube 350 and fills the lower segment 366 with the solvent 254. In some embodiments, when the resist pump system 206 is retracting the resist material 204 of the tube 350, the nozzle cleaning device 230 pushes the solvent 254 into the tube 350 to fill the lower segment 366 with the second solvent 254. In some embodiments, a lowest segment 370 below the lower segment 366 between the bottom level 314 and the bottom 374 remains empty. In some embodiments, when the resist pump system 206 is retracting the resist material 204, resist material residues 352 remain on the inner surface wall of the tube 350 at the locations where the resist material 204 is retracted, e.g., at the lowest segment 370, the lower segment 366, and the middle segment 364. In some embodiments, the resist material residues 352 in the lowest segment 370 is either cleaned during the tip 260 cleaning, or is dissolved in the solvent 254 when the solvent 254 flows into the tube 350 to fill the lower segment 366. In some embodiments, the resist material residues 352 in the lower segment 366 is dissolved in the solvent 254, however, the resist material residues 352 in the middle segment 364 remain. In some embodiments, when the resist pump system 206 retracts the resist material 204, air goes into the middle segment 364.

Figure 4A:
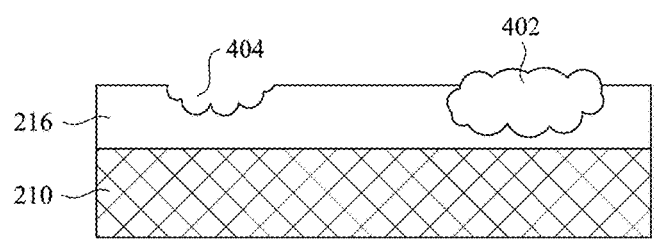
FIGS. 4A, 4B, 4C, 4D, and 4E illustrate resist defects on a top surface of a substrate.
Figure 4B:
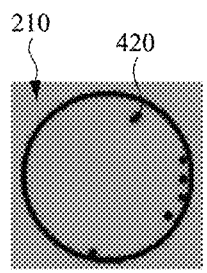
Figure 4C:
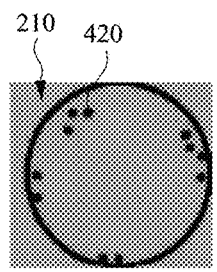
Figure 4D:
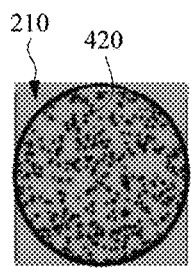
Figure 4E:
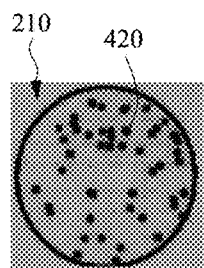

FIGS. 4A, 4B, 4C, 4D, and 4E illustrate resist defects on a top surface of a substrate. FIG. 4A shows the substrate 210 with the resist layer 216 on top of the substrate 210. As discussed, the resist layer 216 is inspected after the PAB operation 104 or after the PEB operation 108 in some embodiments. The resist layer 216 may have a defect 404, such as a void in the resist layer 216. In some embodiments, the resist layer 216 is a portion of the resist material that remains on the wafer for a subsequent process step. The defect 404 is produced because the resist layer 216 included a crystallization defect on top surface of the resist layer and the crystallization defect did not attach to the resist layer 216, creating a void. After the defect 404 is removed and the void is created, the remaining portion of the resist layer 216 under the defect 404 may not have enough thickness to protect the devices under the resist layer 216 in subsequent process steps.

Another defect 402 is shown in the resist layer 216, e.g., a crystallization defect. In some embodiments, the resist layer 216 is a portion of a positive tone resist material that is exposed in the exposure operation 106. Because of the defect 402, the resist material under the defect 402 may not receive a sufficient exposure dose and, thus, may not become soluble in the developer. In other embodiments, the resist layer 216 is a portion of a negative tone resist material that is exposed in the exposure operation 106. Because of the defect 402, the negative tone resist material under the defect 402 may not receive a sufficient exposure dose and, thus, may not become insoluble in the developer. In some embodiments, the defect 402 may cause the removal of a portion of the resist layer 216 when the portion should remain; or a portion of the resist layer 216 to remain when the portion should be removed.

Figure 5:
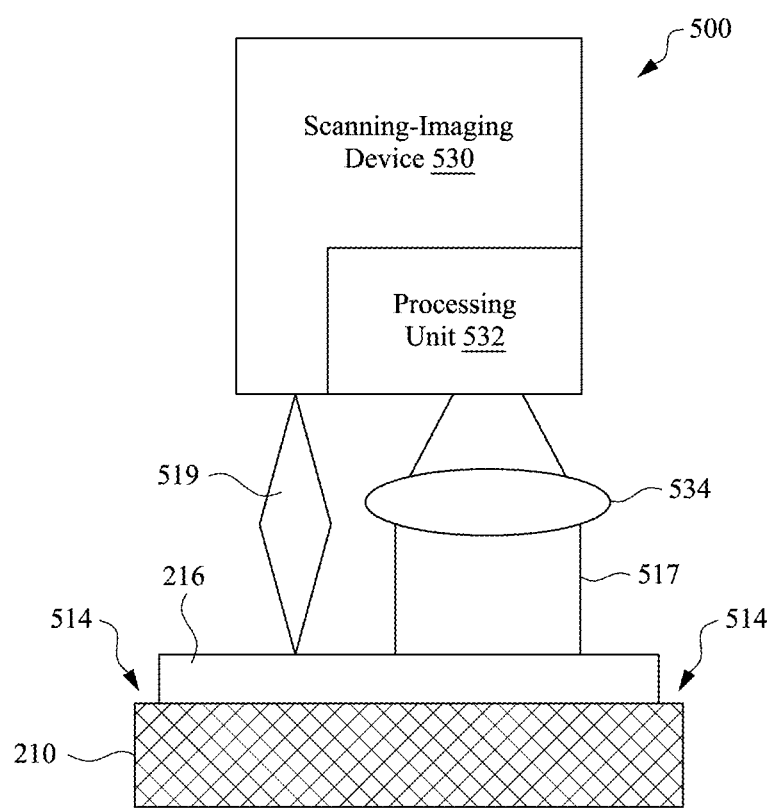
FIG. 5 illustrates a system for inspecting the resist layer disposed on a substrate for defects.

FIGS. 4B, 4C, 4D, and 4E illustrate the surface of a resist layer 216 with defects 420. In some embodiments, a scanning-imaging device, e.g., an scanning-imaging device 530 described below with respect to FIG. 5 is used to inspect the surface of the resist layer. In some embodiments, the resist layer 216 is deposited, e.g., coated, on the substrate 210 and the surface is inspected by the scanning-imaging device after the PAB operation 104, after the exposure operation 106, or after the PEB operation 108. Images obtained by the scanning imaging device are inspected and the number and locations of the defects 420, e.g., the crystallization defects 420, on the resist layer 216 are determined. As shown in FIGS. 4B, 4C, 4D, and 4E, the number of defects 420 is different. In addition, FIGS. 4B, 4C, and 4E have larger defects 420 compared to FIG. 4D, however, FIG. 4D has more smaller defects 420. The number of defects may be determined, e.g., calculated as a total number of defects on a wafer or as a map of the number of defects in a unit area, e.g., in each square millimeter of the wafer surface. In some embodiments a threshold number of defects or threshold defect size is determined, and the wafers containing defects above the threshold number of defects are rejected. In some embodiments, the threshold number of defects of the wafer is between 0 and 3000. In some embodiments, the threshold defect size is between 5 nm and 20 nm and the defects having a size larger than the threshold defect size are counted in the number of defects.

FIG. 5 illustrates a system 500 for inspecting the resist layer 216 disposed on the substrate 210 for defects. In some embodiments, the substrate 210 including the resist layer 216 is baked in the PAB operation 104, to drive out solvent in the resist material 204 and solidify the resist layer 216 and the resist layer 216 is inspected for defects after the PAB operation 104. In some embodiments, the PEB operation 108, is performed on the resist layer 216 after the exposure operation 106 and the resist layer 216 is inspected for defects after the PEB operation. In addition, FIG. 5 shows a scanning-imaging device 530 that generates a focusing beam 519 for scanning a top surface of the resist layer 216 and generating an image of the top surface of the resist layer 216. Also, FIG. 5 shows the scanning-imaging device 530 and a lens 534 that generates a uniform beam 517 for imaging a top surface of the resist layer 216 and generating the image of the top surface of the resist layer 216 to inspect the top surface of the resist layer 216. In addition, the scanning-imaging device 530 includes a processing unit 532, e.g., an image processing unit, to process the generated image of the top surface of the resist layer 216. In some embodiments, the processing unit 532 performs one or more image processing and/or image recognition algorithms on the generated image of the top surface of the resist layer 216 and determines one or more defects in the generated image. In some embodiments, the processing unit 532 performs a blob analysis and determines the defects of the generated image and ranks the determined defects based on size or severity. In some embodiments, the severity of defects is defined based on the location of the defect such as proximity to critical features of the layout pattern and if the defect causes CD non-uniformity. In some embodiments, the focusing beam 519 and the uniform beam 517 are light beams. In some embodiments, the focusing beam 519 is an electron beam. As described with respect to FIG. 2A, a protection region is coated in an edge region 514, consistent with the edge region 214 of FIG. 2A, around an edge of the substrate 210 to prevent the resist material 204 from spilling over the edge of the substrate 210 in some embodiments. In some embodiments, the substrate 210 is placed on a stage, e.g., the stage 240 of FIGS. 2A and 2B and a stage controller of the stage moves the substrate 210 with respect to the scanning-imaging device 530. In some embodiments, the stage controller coordinates the imaging system and the movement of the substrate 210 and enables the imaging system to capture a pattern of the resist material disposed on the substrate 210 at different locations of the substrate 210.

Figure 6:
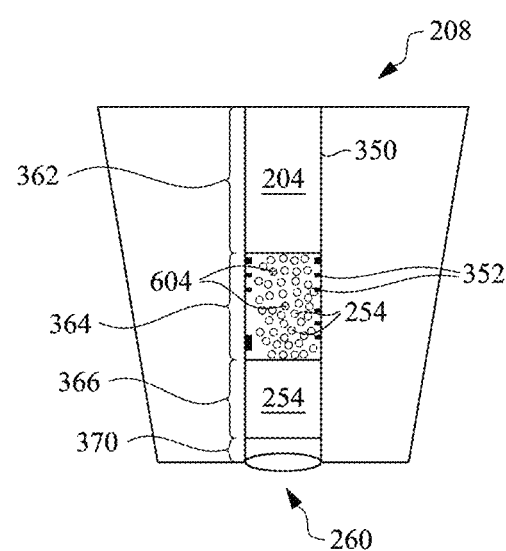
FIG. 6 illustrates the resist dispensing nozzle of the resist pump system when idle in accordance with some embodiments of the present disclosure.

FIG. 6 illustrates resist dispensing nozzle 208 of the resist pump system 206 when idle in accordance with some embodiments of the present disclosure. FIG. 6 is consistent with FIG. 3B and shows the tip 260 and the tube 350 with the upper segment 362, the middle segment 364, the lower segment 366, and the lowest segment 370. The upper segment 362 is filled with resist material 204 and the lower segment 366 is filled with the second solvent 254. In some embodiments, the resist material 204 is dissolved in a first solvent 604 and, thus, the resist material 204 flows. FIG. 6 also shows the resist material residues 352 attached to the inner surface wall of the tube 350. In some embodiments, the resist material residues 352 are in liquid form and are dissolved in the first solvent 604. In some embodiments, as discussed above, the first solvent 604 evaporates in the middle segment 364 after a period of time and the resist material residues 352 remain on inner surface wall. In some embodiments, the middle segment 364 between the upper segment 362 and lower segment 366 is an empty volume containing only air, and does not have either the resist material 204 or the second solvent 254. Thus, the resist material solvent 604 evaporates and the resist material residues 352 may crystallize and/or harden. In some embodiments, in a subsequent dispensing of the resist material, the flowing resist material 204 carries the hardened resist material residues 352 that are on the inner surface wall of the tube 350 and deposits them on the substrate 210.

In some embodiments, to prevent the resist material solvent 604 from evaporating, e.g., from evaporating faster than a threshold time, a second solvent 254 having a higher vapor pressure than the vapor pressure of the first solvent 604 is selected. A liquid with higher vapor pressure evaporates faster than a liquid with lower vapor pressure. As shown in FIG. 6, the empty volume, which is the volume of the middle segment 364 contains vapor molecules of the first solvent 604 and vapor molecules of the second solvent 254. In addition, the empty volume may include the air. As discussed, the vapor pressure of the second solvent 254 is larger than the vapor pressure of the first solvent 604 and, thus, the empty volume is mostly filled with the vapor molecules of the second solvent 254, which prevents evaporation of the first solvent and, thus, keeps the resist material residues 352 dissolved in first solvent in liquid form. Keeping the resist material residues 352 dissolved in the first solvent in liquid form prevents the resist material residues 352 from hardening and/or crystalizing and, thus, reduces the number of defects that are produced in the resist layer 216. In some embodiments, the vapor pressure of the second solvent 254 is between 0.85 kilopascal (kPa) and 1.2 kPa and the vapor pressure of the first solvent 604 is between 0.40 kPa and 0.80 kPa.

In some embodiments, if the vapor pressure of the second solvent 254 is much higher than the vapor pressure of the first solvent 604 of the resist material 204, the second solvent 254 may completely evaporate to the air at lower segment 366 through the tip 260, thereby allowing the empty volume in middle segment 364 to contact the outside air. Direct contact of the empty volume to the outside air may increase the evaporation rate of the resist material solvent 604. In some embodiments, the second solvent 254 is a mixture of two solvents, 241A and 241B as shown in FIG. 2C. In some embodiments, the vapor pressure of the solvent 241A is between about 0.4 kPa and 0.6 kPa, which is smaller than the vapor pressure of the first solvent 604 of the resist material 204. The vapor pressure of the solvent 241B is between about 1.15 kPa and 1.25 kPa, which is greater than the vapor pressure of the first solvent 604 of the resist material 204. In some embodiments, for the second solvent 254 that is a combination of the solvents 241A and 241B, the volume ratio of the solvent 241B in the mixture is between 5 to 50 percent more than the volume ratio of the solvent 241A in the mixture. In some examples, the solvent 241B is one or a mixture of isopropanol, cyclohexane, or t-butyl alcohol. In some examples, the solvent 241A is one or a mixture of N-methyl-2-pyrrolidone (NMP), propylene glycol methyl ether (PGME), propylene glycol methyl ether acetate (PGMEA), or dimethyl sulfoxide (DMSO). In some embodiments, the volume concentration ratio of the solvent 241B to the solvent 241A is in the range between about 1.1 (52.5/47.5) and 3.0 (75/25).

As discussed, in some embodiments, the second solvent 254 is a mixture of two solvents 241A and 241B, from the two solvent supplies 232A and 232B shown in FIG. 2C. In some embodiments, the vapor pressure of the mixture of the two solvents 241A and 241B from the two solvent supplies 232A and 232B is between 0.85 kPa and 1.2 kPa. In some embodiments, the vapor pressure of the solvent 241A, having a lower vapor pressure, is less than 0.85 kPa, e.g., between about 0.4 kPa and 0.6 kPa. In some embodiments, and the vapor pressure of the solvent 241B, having a higher vapor pressure, is between about 1.15 kPa and 1.25 kPa, which is greater than 0.85 kPa. In some embodiments, the vapor pressure ratio of the two or more solvents of the solvent supplies of FIG. 2C is in the range between 1.9 (1.15/0.6) and 3.1 (1.25/0.4).

Thus, as discussed, the vapor pressure of the second solvent 254 is higher than the vapor pressure of the first solvent 604. Nonetheless, if the resist material residues 352 are left for a long time, part of the resist material residues 352 harden and/or crystallize because either the second solvent 254 completely evaporates from the tip 260 or because of some leaks is the middle segment 364, allowing part of the evaporated first solvent 604 to escape. Therefore, for each combination of the second solvent 254 and the first solvent 604, a threshold time is determined that within the threshold time the resist material residues 352 do not harden and/or crystallize. In some embodiments, there are reasons, other than hardening of the resist material residues 352, that produce defects in the resist material. Thus, a threshold number of defects is determined, in some embodiments, as the acceptable number of defects. In some embodiments, the number of defects and the threshold number of defects is defined as the number of defects per unit area, e.g., number of defects per mm$^2$. Thus, in some embodiments, the threshold time is defined based on the threshold number of defects.

Figure 7:
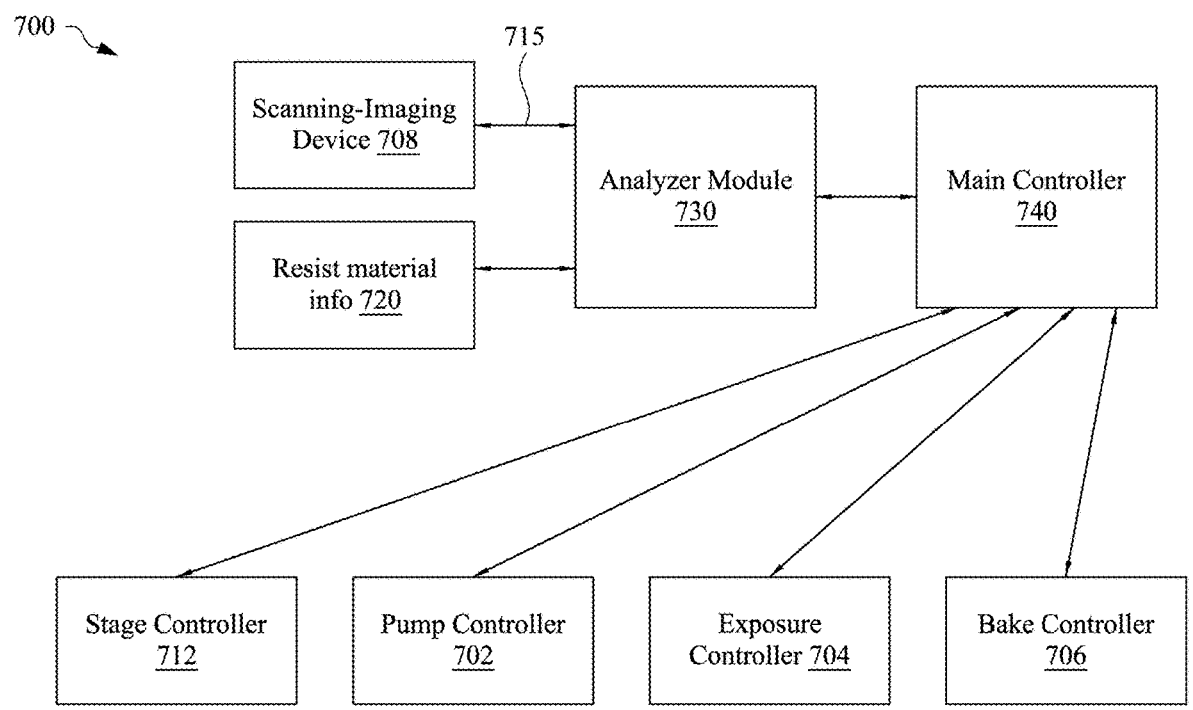
FIG. 7 shows a control system for operating a resist material dispensing system and generating a pattern in a resist material layer in accordance with some embodiments of the present disclosure.

FIG. 7 shows a control system for operating a resist material dispensing system and generating a pattern in a resist material layer in accordance with some embodiments of the present disclosure. The control system 700 includes an analyzer module 730 and a main controller 740 coupled to each other. The analyzer module 730 is coupled to a scanning-imaging device 708 (consistent with the scanning-imaging device 530 of FIG. 5) and may receive information of the defects of a resist layer, e.g., information 715 of the defects on the top surface of the resist layer 216 of FIG. 4B, 4C, 4D or 4E. The scanning-imaging device 708 may generate a map of the defects on the surface of the resist layer 216 of FIG. 4B, 4C, 4D or 4E. In some embodiments, the analyzer module 730 also receives information about the resist material, e.g., the resist material information 720. The analyzer module 730 may extract, from the resist material information 720, the type of the resist material, such as a positive tone resist material or a negative tone resist material and an energy density that should be delivered to the resist material to fully expose the resist material.

In some embodiments, the main controller 740 is coupled to a pump controller 702, an exposure controller 704, a bake controller 706, and a stage controller 712. In some embodiments, referring to FIG. 2A, the pump controller 702 is consistent with the pump controller 220 and the stage controller 712 is included in the stage 240. In some embodiments, and based on the information 715 of the defects, the analyzer module 730 generates a density of the defects on the surface of the resist layer 216. In some embodiments, and based on the density of the defects, the analyzer module 730 adjusts the threshold time between consecutive two resist material dispensing. In some embodiments, the pump controller 702 that is coupled to the solvent mixer 231, commands the solvent mixer 231 and adjusts the concentration ratios of the solvents of the plurality of solvents in the second solvent 254 such that the vapor pressure of the mixture of the second solvent 254 prevents evaporation of the first solvent in the resist material residues 352 and, thus, keeps the resist material residues 352 in liquid form. In some embodiments, as shown in FIG. 2C, the pump controller 220 selects two or more of the solvent supplies and commands the solvent mixer 231 to adjust the concentration ratios of the solvents from the selected solvent supplies in the mixture of the second solvent 254 such that the vapor pressure of the mixture of the second solvent 254 prevents evaporation of the first solvent in the resist material residues 352.

In some embodiments, the analyzer module 730 determines, based on the resist material information 720, an amount of time and temperature to heat the substrate, e.g., for the PAB operation 104 or the PEB operation 108. The analyzer module 730 commands the bake controller 706 through the main controller 740 to perform the PAB operation 104 or the PEB operation 108. The bake controller 706 is consistent with a controller (not shown) of the PAB operation 104 or the PEB operation 108. In some embodiments, the analyzer module 730 determines, based on the resist material information 720, an amount of energy to fully expose the resist material to produce a layout pattern in the resist material. The analyzer module 730 commands the exposure controller 704 through the main controller 740 to turn on a radiation source (not shown) to expose the resist layer 216 to the radiation. The exposure controller 704 is consistent with a controller (not shown) of the exposure operation 106 of FIG. 1.

Figure 8:
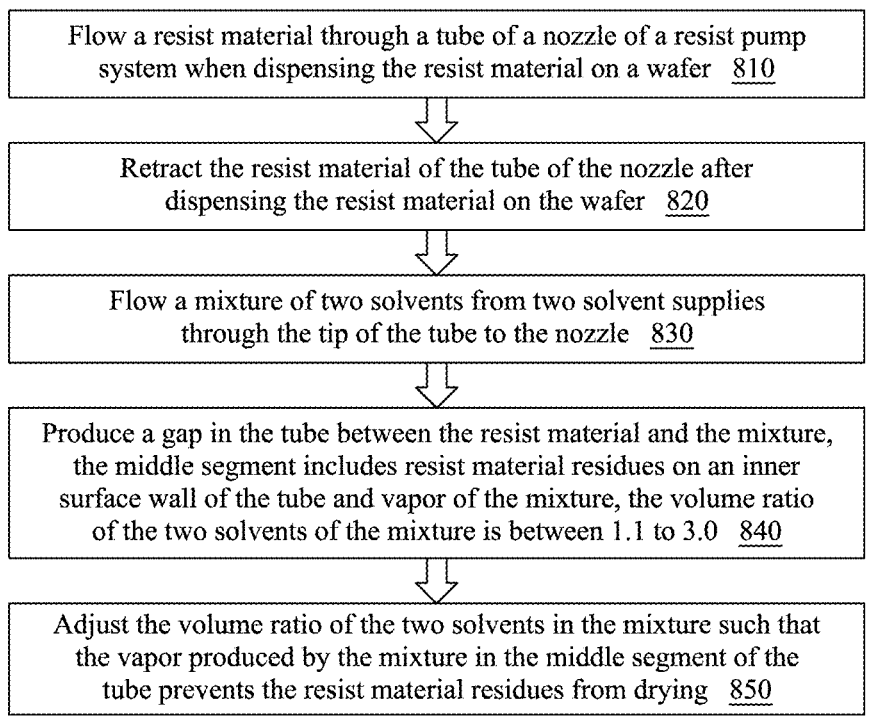
FIG. 8 illustrates a flow diagram of an exemplary process for operating a resist material dispensing system in accordance with some embodiments of the present disclosure.

FIG. 8 illustrates a flow diagram of an exemplary process 800 for controlling a resist dispensing system some in accordance with some embodiments of the present disclosure. In some embodiments, the process 800 is performed by the control system 700 of FIG. 7 or the computer system 900 of FIGS. 9A and 9B. In operation 810, a resist material flows through a tip of a tube of a nozzle of a resist pump system when dispensing the resist material on a wafer. In some embodiments, and as shown in FIGS. 2A and 3A, a flow of the resist material from the resist material supply 202 through the tube 350 and the tip 260 of the resist dispensing nozzle 208 is produced. In some embodiments, the flow is produced by the resist pump system 206 and controlled by the pump controller 220.

At operation 820, the resist material of the tube of the nozzle is retracted after dispensing the resist material on the wafer. After dispensing the resist material as shown in FIG. 3A, the resist material 204 is retracted from the lower segment 366 and the middle segment 364 as shown in FIG. 3B.

At operation 830, a mixture of two solvents 241A and 241B from two solvent supplies 232A and 232B flows through the tip of the tube to the nozzle. As shown in FIG. 2B, the second solvent 254 is transferred through the tip 260 of the resist dispensing nozzle 208 and as shown in FIG. 3B, the second solvent 254 supplied by the solvent supplies 232A and 232B fills the lower segment 366. As shown in FIG. 2C, the second solvent 254 is a mixture of two solvents 241A and 241B. At operation 840, the gap 365 is produced between the resist material 204 and the second solvent 254. In some embodiments as shown in FIG. 3B, the gap 365, e.g., the empty volume, is produced in the middle segment 364 between the second solvent 254 and the resist material 204. In some embodiments, the volume ratio of the two solvents 241B and 241A (the volume ratio of 241B over the volume ratio of 241A) of the mixture is between 1.1 to 3.0.

At operation 850, the volume ratio of the two solvents in the mixture is adjusted such that the vapor produced by the mixture in the middle segment of the tube prevents the resist material residues from drying. In some embodiments, resist material residues 352 exist on inner surface wall of the gap 365 and a vapor form of the mixture essentially fills the gap 365 and inhibits the first solvent 604 of the resist material 204 and the resist material residues 352 from evaporating into the gap 365. In some embodiments, the vapor pressure of the mixture is greater than the vapor pressure of the first solvent 604 and thus the gap 365 is essentially filled by the mixture vapors such that the mixture vapors do not allow the first solvent 604 to vaporize.

Figure 9A:
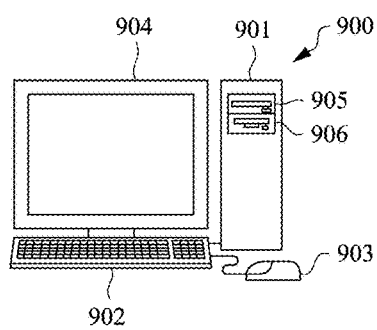
FIGS. 9A and 9B illustrate an apparatus for operating a resist material dispensing system and generating a pattern in a resist material layer in accordance with some embodiments of the present disclosure.
Figure 9B:
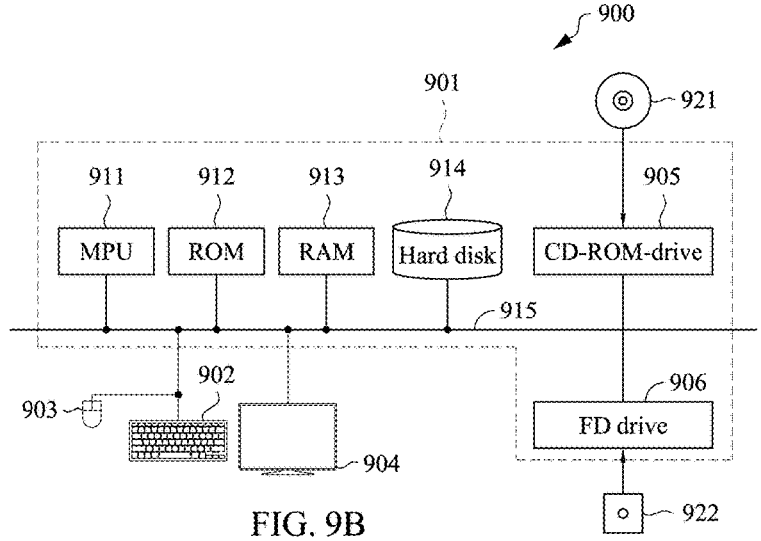

FIGS. 9A and 9B illustrate an apparatus for operating a resist material dispensing system and generating a pattern in a resist material layer in accordance with some embodiments of the present disclosure. In some embodiments, the computer system 900 is used for performing the functions of the modules of FIG. 7 that include the main controller 740, the analyzer module 730, the stage controller 712, pump controller 702, the exposure controller 704, and the bake controller 706. In some embodiments, the computer system 900 is used to execute the process 800 of FIG. 8. In some embodiments, the computer system 900 controls a resist material dispensing system consistent with the resist material dispensing system 200 of FIG. 2A. In addition, the computer system 900 controls heating the substrate, exposing the substrate to radiation, and scanning or imaging the substrate.

FIG. 9A is a schematic view of a computer system that performs the functions of an apparatus for controlling the dispensing of the resist material on a substrate and generating a pattern in a resist material layer. All of or a part of the processes, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors, such as a micro processing unit (MPU) 911, a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the control system for controlling the dispensing of the resist material on a substrate in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the control system for the dispensing of the resist material on a substrate and generating a pattern in a resist material layer in the foregoing embodiments. The program may only include a command portion to call an appropriate function (module) in a controlled mode and obtain desired results.

Embodiments of the disclosure prevent the solvent in the resist material from evaporating, and thus, prevents resist material residues from crystallizing in the nozzle of the resist material dispensing system. The prevention of the formation crystallized resist material residues prevents the subsequent contamination of workpieces by the crystallized residues and prevent clogs in the photoresist dispensing system caused by the crystallized residues.

According to some embodiments, a method for dispensing a resist material includes flowing a resist material through a nozzle of a pump system on a wafer. The nozzle includes a tube extending from a top to a bottom of the nozzle and having an upper segment, a lower segment, and a middle segment between the upper segment and the lower segment. The resist material is dispensed through the tube. The method includes retracting the resist material in the tube when not dispensing the resist material on the wafer. The resist material in the tube is retracted from the lower segment and from the middle segment of the tube and the resist material is maintained in the upper segment of the tube. When retracting the resist material in the tube, the method includes flowing a first solvent through a tip of the nozzle at the bottom of the nozzle to fill the lower segment of the tube with the first solvent and producing a gap in the middle segment of the tube between the resist material and the first solvent. The middle segment includes resist material residues on an inner surface wall of the tube and vapor of the first solvent. The vapor of the first solvent in the middle segment of the tube prevents the resist material residues from drying. In an embodiment, the method further includes flowing the resist material from a resist supply to the nozzle of a pump system, producing a pattern on the resist material on the wafer, detecting an average number of defects per unit area of the resist material on the wafer, and determining a time difference between subsequent dispensing of the resist material such that the average number of defects per unit area remains below a threshold number of defects. In an embodiment, the method further includes determining the average number of defects per unit area of the resist material on the wafer, and reducing a time difference between subsequent dispensing if the average number of defects per unit area is above a threshold number of defects. In an embodiment, the resist material includes a second solvent and providing the first solvent in the lower segment inhibits the second solvent from evaporating. In an embodiment, a vapor pressure of the second solvent is less than a vapor pressure of the first solvent. In an embodiment, the method further includes cleaning a tip of the nozzle by the first solvent prior to filling the lower segment of the tube with the first solvent.

According to some embodiments of the present disclosure, a method for dispensing a resist material includes flowing a resist material through a nozzle on a wafer. The nozzle includes a tube extending from a top to a bottom of the nozzle and having an upper segment, a lower segment, and a middle segment between the upper segment and the lower segment. The resist material is dispensed through the tube. The method includes flowing the resist material in the tube through the upper segment, the middle segment, and the lower segment when dispensing the resist material. The method also includes retracting the resist material in the tube when not dispensing the resist material on the wafer. The resist material of the tube is retracted from the lower segment and from the middle segment of the tube, and the resist material is maintained in the upper segment of the tube. When retracting the resist material in the tube, the method includes flowing a mixture of a first solvent and a second solvent through a tip of the nozzle at the bottom of the nozzle to fill the lower segment of the tube with the mixture and producing a gap in the middle segment of the tube between the resist material and the mixture. The middle segment includes resist material residues on an inner surface wall of the tube and vapor of the mixture. The volume ratio of the second solvent to the first solvent of the mixture is between 1.1 to 3.0. The vapor produced by the mixture in the middle segment of the tube prevents the resist material residues from drying. In an embodiment, the resist material and the resist material residues are dissolved in a third solvent, and the vapor produced by the mixture prevents the third solvent from evaporating in the middle segment. In an embodiment, a majority of vapor in the gap of the middle segment is produced by the mixture. In an embodiment, the method further includes introducing air in the gap of the middle segment when retracting the resist material in the tube. In an embodiment, the vapor pressure of the mixture is between 0.85 kilopascal (kPa) and 1.2 kPa, and the vapor pressure of the third solvent is between 0.75 kPa and 0.80 kPa. In an embodiments, a vapor pressure of the first solvent is less than the vapor pressure of the third solvent and a vapor pressure of the second solvent is greater than the vapor pressure of the third solvent. A ratio by volume of the second solvent in the mixture is at least 5 percent more than a ratio by volume of the first solvent in the mixture.

According to some embodiments of the present disclosure, a method for dispensing a resist material includes flowing a resist material in a tube of a nozzle extending from a top to a bottom of the nozzle to dispense the resist material through a tip of the nozzle at the bottom of the nozzle on a wafer. The method includes retracting the resist material in the tube when not dispensing the resist material on the wafer. The method further includes when retracting the resist material of the tube, flowing a mixture comprising a first solvent and a second solvent through the tip of the nozzle to partially fill the tube with the mixture through the bottom of the nozzle. The method also includes producing a gap in the tube between the resist material and the mixture. An inner surface wall of the tube surrounding the gap includes resist material residues and the gap includes vapor of the mixture. The vapor of the mixture in the gap prevents the resist material residues from drying. The method includes cleaning the tip of the nozzle by the mixture prior to flowing the mixture through the tip of the nozzle. In an embodiment, the resist material and the resist material residues are dissolved in a third solvent, and the vapor produced by the mixture prevents the third solvent from evaporating in the gap. In an embodiment, the method further includes receiving the resist material from a resist material supply. In an embodiment, the method further includes adjusting ratios of the first and the second solvents in the mixture such that the vapor produced by the mixture in the middle segment of the tube prevents the resist material residues from drying. In an embodiment, after the retracting the resist material of the tube when not dispensing, the method further includes begin dispensing the resist material on the wafer to dispose a resist material layer on the wafer. In an embodiment, the method further includes capturing an image of the disposed resist material layer on the wafer and determining a number or size of defects from the captured image of the disposed resist material layer. In an embodiment, the method further includes determining an average number of defects per unit area of the disposed resist material layer and reducing a threshold time between consecutive resist material dispensing of the nozzle if the average number of defects per unit area of the disposed resist material layer is larger than a threshold number of defects. In an embodiment, blob analysis is used to determine whether the size of the defects have an area larger than a threshold defect size.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    flowing a resist material through a nozzle of a pump system on a wafer, wherein the nozzle comprises a tube extending from a top to a bottom of the nozzle and having an upper segment, a lower segment, and a middle segment between the upper segment and the lower segment, and wherein the resist material is dispensed through the tube;
    retracting the resist material in the tube when not dispensing the resist material on the wafer, wherein the resist material in the tube is retracted from the lower segment and from the middle segment of the tube, and wherein the resist material is maintained in the upper segment of the tube;
    when retracting the resist material in the tube, flowing a first solvent through a tip of the nozzle at the bottom of the nozzle to fill the lower segment of the tube with the first solvent; and
    producing a gap in the middle segment of the tube between the resist material and the first solvent, wherein the middle segment includes vapor of the first solvent and resist material residues on an inner surface wall of the tube,
    wherein the vapor of the first solvent in the middle segment of the tube prevents the resist material residues from drying, wherein the resist material comprises a second solvent, and wherein a vapor pressure of the second solvent is less than a vapor pressure of the first solvent wherein the vapor pressure of the second solvent is between 0.85 kPa and 1.2 kPa and the vapor pressure of the first solvent is between 0.40 kPa and 0.80 kPa.

2. The method of claim 1, further comprising:
    flowing the resist material from a resist supply to the nozzle of a pump system;
    producing a pattern on the resist material on the wafer;
    detecting an average number of defects per unit area of the resist material on the wafer; and
    determining a time difference between subsequent dispensing of the resist material such that the average number of defects per unit area remains below a threshold number of defects.

3. The method of claim 2, further comprising:
    determining the average number of defects per unit area of the resist material on the wafer; and
    reducing a time difference between subsequent dispensing if the average number of defects per unit area is above a threshold number of defects.

4. The method of claim 1, wherein providing the first solvent in the lower segment inhibits the second solvent from evaporating.

5. The method of claim 1, further comprising:
    cleaning a tip of the nozzle by the first solvent prior to filling the lower segment of the tube with the first solvent.

6. The method of claim 1, further comprising: receiving the resist material from a resist material supply.

7. A method, comprising:
    flowing a resist material through a nozzle on a wafer, wherein the nozzle comprises a tube extending from a top to a bottom of the nozzle and having an upper segment, a lower segment, and a middle segment between the upper segment and the lower segment, and wherein the resist material is dispensed through the tube;
    flowing the resist material in the tube through the upper segment, the middle segment, and the lower segment when dispensing the resist material;
    retracting the resist material in the tube when not dispensing the resist material on the wafer, wherein the resist material in the tube is retracted from the lower segment and from the middle segment of the tube, and wherein the resist material is maintained in the upper segment of the tube;
    when retracting the resist material in the tube, flowing a mixture of a first solvent and a second solvent through a tip of the nozzle at the bottom of the nozzle to fill the lower segment of the tube with the mixture; and
    producing a gap in the middle segment of the tube between the resist material and the mixture, wherein the middle segment includes vapor of the mixture and resist material residues on an inner surface wall of the tube,
    wherein a volume ratio of the second solvent to the first solvent of the mixture is between 1.1 to 3.0, wherein the vapor produced by the mixture in the middle segment of the tube prevents the resist material residues from drying, wherein the resist material and the resist material residues are dissolved in a third solvent, and wherein a vapor pressure of the mixture is greater than a vapor pressure of the third solvent wherein the vapor pressure of the mixture is between 0.85 kPa and 1.2 kPa and the vapor pressure of the third solvent is between 0.75 kPa and 0.80 kPa.

8. The method of claim 7, wherein the vapor produced by the mixture prevents the third solvent from evaporating in the middle segment.

9. The method of claim 8, wherein a majority of vapor in the gap of the middle segment is produced by the mixture.

10. The method of claim 9, further comprising:
introducing air in the gap of the middle segment when retracting the resist material in the tube.

11. The method of claim 8, wherein a vapor pressure of the first solvent is less than the vapor pressure of the third solvent and a vapor pressure of the second solvent is greater than the vapor pressure of the third solvent, and wherein a ratio by volume of the second solvent in the mixture is at least 5 percent more than a ratio by volume of the first solvent in the mixture.

12. A method, comprising:
flowing a resist material in a tube of a nozzle extending from a top to a bottom of the nozzle to dispense the resist material through a tip of the nozzle at the bottom of the nozzle on a wafer;
retracting the resist material of the tube when not dispensing the resist material on the wafer;
when retracting the resist material of the tube, flowing a mixture comprising a first solvent and a second solvent through the tip of the nozzle to partially fill the tube with the mixture through the bottom of the nozzle;
producing a gap in the tube between the resist material and the mixture, wherein an inner surface wall of the tube surrounding the gap includes resist material residues and the gap includes vapor of the mixture, wherein the vapor of the mixture in the gap prevents the resist material residues from drying; and
cleaning the tip of the nozzle by the mixture prior to flowing the mixture through the tip of the nozzle, wherein the resist material and the resist material residues are dissolved in a third solvent, and wherein a vapor pressure of the mixture is greater than a vapor pressure of the third solvent wherein the vapor pressure of the mixture is between 0.85 kPa and 1.2 kPa and the vapor pressure of the third solvent is between 0.75 kPa and 0.80 kPa.

13. The method of claim 12, wherein the vapor produced by the mixture prevents the third solvent from evaporating in the gap.

14. The method of claim 12, further comprising:
receiving the resist material from a resist material supply.

15. The method of claim 12, further comprising:
adjusting ratios of the first and the second solvents in the mixture such that the vapor produced by the mixture in a middle segment of the tube prevents the resist material residues from drying.

16. The method of claim 12, further comprising:
after the retracting the resist material in the tube when not dispensing, begin dispensing the resist material on the wafer to dispose a resist material layer on the wafer.

17. The method of claim 16, further comprising:
capturing an image of the disposed resist material layer on the wafer; and
determining a number or size of defects from the captured image of the disposed resist material layer.

18. The method of claim 17, further comprising:
determining an average number of defects per unit area of the disposed resist material layer; and
reducing a threshold time between consecutive resist material dispensing of the nozzle if the average number of defects per unit area of the disposed resist material layer is larger than a threshold number of defects.

19. The method of claim 17, wherein blob analysis is used to determine whether defects from the captured image have an area larger than a threshold defect size.

20. The method of claim 15, further comprising introducing air in the gap of the middle segment when retracting the resist material in the tube.

\* \* \* \* \*